(12) United States Patent
Fork et al.

(10) Patent No.: US 7,780,812 B2
(45) Date of Patent: Aug. 24, 2010

(54) EXTRUSION HEAD WITH PLANARIZED EDGE SURFACE

(75) Inventors: David K. Fork, Los Altos, CA (US); Thomas S. Zimmerman, Jena (DE)

(73) Assignee: Palo Alto Research Center Incorporated, Palo Alto, CA (US)

( * ) Notice: Subject to any disclaimer, the term of this patent is extended or adjusted under 35 U.S.C. 154(b) by 941 days.

(21) Appl. No.: 11/555,512

(22) Filed: Nov. 1, 2006

(65) Prior Publication Data

US 2008/0099952 A1 May 1, 2008

(51) Int. Cl.
*B32B 38/10* (2006.01)
(52) U.S. Cl. ............... 156/267; 425/127; 425/133.5
(58) Field of Classification Search ............ 137/837, 137/836, 835, 828; 425/DIG. 30, 133.5, 425/127; 156/256, 257, 264, 250, 267
See application file for complete search history.

(56) References Cited

U.S. PATENT DOCUMENTS

| | | | |
|---|---|---|---|
| 2,031,387 A | * | 2/1936 | Schwarz ............ 425/463 |
| 2,789,731 A | | 4/1957 | Marraffino |
| 3,032,008 A | | 5/1962 | Land et al. |
| 3,159,313 A | | 12/1964 | Guilford |
| 3,602,193 A | | 8/1971 | Adams et al. |
| 3,973,994 A | | 8/1976 | Redfield |
| 3,988,166 A | | 10/1976 | Beam |
| 4,018,367 A | | 4/1977 | Morine et al. |
| 4,021,267 A | | 5/1977 | Dettling |
| 4,045,246 A | | 8/1977 | Mlavsky et al. |
| 4,053,327 A | | 10/1977 | Meulenberg, Jr. |
| 4,084,985 A | | 4/1978 | Evans, Jr. |
| 4,086,485 A | | 4/1978 | Kaplow et al. |

(Continued)

FOREIGN PATENT DOCUMENTS

CN 2606309 Y 3/2004

(Continued)

OTHER PUBLICATIONS

Sparber et al. "Comparison of texturing methods for monocrystalline silicon solar cells using KOH and $Na_2CO_3$," 3rd World Conf. Photovoltaic Energy Conversion, Osaka, 2003, pp. 1372-1375.

(Continued)

*Primary Examiner*—Khanh Nguyen
*Assistant Examiner*—Vishal I Patel
(74) *Attorney, Agent, or Firm*—Bever, Hoffman & Harms, LLP; Patrick T. Bever

(57) ABSTRACT

A co-extrusion head for forming high-aspect ratio gridline structures in a micro extrusion apparatus includes multiple sheets (e.g., metal plates) that are machined and assembled to define three-part fluidic channels having associated outlet orifice disposed along an edge surface of the head. Reference surfaces are also etched in the sheets and are aligned in a straight line that intersects output junctions of the three-channel cavities. After assembly (e.g., using high pressure bonding techniques), each reference surface is located inside a notch defined in the edge surface. The edge surface of the co-extrusion head is then trimmed (e.g., machined by wire EDM) using the reference surfaces as a precise guide, thereby producing uniform length outlet orifices with uniform flow impedance.

10 Claims, 9 Drawing Sheets

U.S. PATENT DOCUMENTS

| | | | |
|---|---|---|---|
| 4,095,997 A | 6/1978 | Griffiths | |
| 4,119,058 A | 10/1978 | Schmermund | |
| 4,131,485 A | 12/1978 | Meinel et al. | |
| 4,141,231 A | 2/1979 | Kudlich | |
| 4,148,301 A | 4/1979 | Cluff | |
| 4,153,476 A | 5/1979 | Frosch et al. | |
| 4,177,083 A | 12/1979 | Kennedy | |
| 4,221,468 A | 9/1980 | Macken | |
| 4,224,081 A | 9/1980 | Kawamura et al. | |
| 4,254,894 A | 3/1981 | Fetters | |
| 4,331,703 A | 5/1982 | Lindmayer | |
| 4,337,758 A | 7/1982 | Meinel et al. | |
| 4,355,196 A | 10/1982 | Chai | |
| 4,461,403 A | 7/1984 | Prahs | |
| 4,476,165 A | 10/1984 | McIntyre | |
| 4,490,418 A | 12/1984 | Yoshida | |
| 4,521,457 A | 6/1985 | Russell et al. | |
| 4,540,843 A | 9/1985 | Gochermann et al. | |
| 4,602,120 A | 7/1986 | Wakefield et al. | |
| 4,683,348 A | 7/1987 | Pidgeon et al. | |
| 4,746,370 A | 5/1988 | Woolf | |
| 4,747,517 A | 5/1988 | Hart | |
| 4,792,685 A | 12/1988 | Yamakawa | |
| 4,796,038 A | 1/1989 | Allen et al. | |
| 4,826,777 A | 5/1989 | Ondris | |
| 4,841,946 A | 6/1989 | Marks | |
| 4,847,349 A | 7/1989 | Ohta et al. | |
| 4,849,028 A | 7/1989 | Krause | |
| 4,855,884 A | 8/1989 | Richardson | |
| 4,938,994 A | 7/1990 | Choinski | |
| 4,947,825 A | 8/1990 | Moriarty | |
| 4,952,026 A | 8/1990 | Bellman et al. | |
| 5,000,988 A | 3/1991 | Inoue et al. | |
| 5,004,319 A | 4/1991 | Smither | |
| 5,011,565 A | 4/1991 | Dube et al. | |
| 5,062,899 A | 11/1991 | Kruer | |
| 5,075,281 A | 12/1991 | Testardi | |
| 5,089,055 A | 2/1992 | Nakamura | |
| 5,151,377 A | 9/1992 | Hanoka et al. | |
| 5,167,724 A | 12/1992 | Chiang | |
| 5,180,441 A | 1/1993 | Cornwall et al. | |
| 5,188,789 A | 2/1993 | Nishiura | |
| 5,213,628 A | 5/1993 | Noguchi et al. | |
| 5,216,543 A | 6/1993 | Calhoun | |
| 5,254,388 A | 10/1993 | Melby et al. | |
| 5,344,496 A | 9/1994 | Stern et al. | |
| 5,353,813 A * | 10/1994 | Deevi et al. | 131/194 |
| 5,356,488 A | 10/1994 | Hezel | |
| 5,389,159 A | 2/1995 | Kataoka et al. | |
| 5,449,413 A | 9/1995 | Beauchamp et al. | |
| 5,501,743 A | 3/1996 | Cherney | |
| 5,529,054 A | 6/1996 | Shoen | |
| 5,536,313 A | 7/1996 | Watanabe et al. | |
| 5,538,563 A | 7/1996 | Finkl | |
| 5,540,216 A | 7/1996 | Rasmusson | |
| 5,543,333 A | 8/1996 | Holdermann | |
| 5,552,820 A | 9/1996 | Genovese | |
| 5,559,677 A | 9/1996 | Errichiello | |
| 5,560,518 A | 10/1996 | Catterall et al. | |
| 5,569,399 A | 10/1996 | Penney et al. | |
| 5,590,818 A | 1/1997 | Raba et al. | |
| 5,665,175 A | 9/1997 | Safir | |
| 5,700,325 A | 12/1997 | Watanabe | |
| 5,733,608 A | 3/1998 | Kessel et al. | |
| 5,873,495 A | 2/1999 | Saint-Germain | |
| 5,918,771 A | 7/1999 | van der Heijden | |
| 5,929,530 A | 7/1999 | Stone | |
| 5,949,123 A | 9/1999 | Le et al. | |
| 5,981,902 A | 11/1999 | Arita et al. | |
| 5,990,413 A | 11/1999 | Ortabasi | |
| 6,008,449 A | 12/1999 | Cole | |
| 6,011,307 A | 1/2000 | Jiang et al. | |
| 6,020,554 A | 2/2000 | Kaminar et al. | |
| 6,032,997 A | 3/2000 | Elliott et al. | |
| 6,047,862 A | 4/2000 | Davies | |
| 6,091,017 A | 7/2000 | Stern | |
| 6,118,067 A | 9/2000 | Lashley et al. | |
| 6,130,465 A | 10/2000 | Cole | |
| 6,140,570 A | 10/2000 | Kariya | |
| 6,164,633 A | 12/2000 | Mulligan et al. | |
| 6,203,621 B1 | 3/2001 | Tran et al. | |
| 6,232,217 B1 | 5/2001 | Ang et al. | |
| 6,257,450 B1 | 7/2001 | Jackson et al. | |
| 6,274,508 B1 | 8/2001 | Jacobsen et al. | |
| 6,278,054 B1 | 8/2001 | Ho et al. | |
| 6,293,498 B1 | 9/2001 | Stanko et al. | |
| 6,310,281 B1 | 10/2001 | Wendt et al. | |
| 6,323,415 B1 | 11/2001 | Uematsu et al. | |
| RE37,512 E | 1/2002 | Szlufcik et al. | |
| 6,351,098 B1 | 2/2002 | Kaneko | |
| 6,354,791 B1 | 3/2002 | Wytman et al. | |
| 6,379,521 B1 | 4/2002 | Nishio | |
| 6,398,370 B1 | 6/2002 | Chiu et al. | |
| 6,407,329 B1 | 6/2002 | Iino et al. | |
| 6,410,843 B1 | 6/2002 | Kishi et al. | |
| 6,418,986 B1 | 7/2002 | Gabriele | |
| 6,420,266 B1 | 7/2002 | Smith et al. | |
| 6,423,140 B1 | 7/2002 | Liu et al. | |
| 6,429,037 B1 | 8/2002 | Wenham et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,555,739 B2 | 4/2003 | Kawam | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,663,944 B2 | 12/2003 | Park et al. | |
| 6,666,165 B2 | 12/2003 | Shiraishi et al. | |
| 6,667,434 B2 | 12/2003 | Morizane et al. | |
| 6,743,478 B1 | 6/2004 | Kiiha et al. | |
| 6,890,167 B1 * | 5/2005 | Kwok et al. | 425/72.2 |
| 6,896,381 B2 | 5/2005 | Benitez et al. | |
| 6,924,493 B1 | 8/2005 | Leung | |
| 7,045,794 B1 | 5/2006 | Spallas et al. | |
| 7,101,592 B2 | 9/2006 | Gueggi et al. | |
| 7,152,985 B2 | 12/2006 | Benitez et al. | |
| 7,160,522 B2 | 1/2007 | Dominguez et al. | |
| 7,181,378 B2 | 2/2007 | Benitez et al. | |
| 7,388,147 B2 | 6/2008 | Mulligan et al. | |
| 7,394,016 B2 | 7/2008 | Gronet | |
| 2001/0008230 A1 | 7/2001 | Keicher et al. | |
| 2002/0056473 A1 | 5/2002 | Chandra et al. | |
| 2002/0060208 A1 | 5/2002 | Liu et al. | |
| 2002/0148497 A1 | 10/2002 | Sasaoka et al. | |
| 2002/0149107 A1 | 10/2002 | Chang et al. | |
| 2002/0154396 A1 | 10/2002 | Overbeck | |
| 2003/0015820 A1 | 1/2003 | Yamazaki et al. | |
| 2003/0095175 A1 | 5/2003 | Agorio | |
| 2003/0129810 A1 | 7/2003 | Barth et al. | |
| 2003/0201581 A1 | 10/2003 | Weber et al. | |
| 2003/0232174 A1 | 12/2003 | Chang et al. | |
| 2004/0012676 A1 | 1/2004 | Weiner | |
| 2004/0031517 A1 | 2/2004 | Bareis | |
| 2004/0048001 A1 | 3/2004 | Kiguchi et al. | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka | |
| 2004/0200520 A1 | 10/2004 | Mulligan et al. | |
| 2004/0211460 A1 | 10/2004 | Simburger et al. | |
| 2005/0000566 A1 | 1/2005 | Posthuma et al. | |
| 2005/0029543 A1 | 2/2005 | Gambino et al. | |
| 2005/0034751 A1 | 2/2005 | Gross et al. | |

| | | | |
|---|---|---|---|
| 2005/0046977 | A1 | 3/2005 | Shifman |
| 2005/0067729 | A1* | 3/2005 | Laver et al. .............. 264/45.9 |
| 2005/0081908 | A1 | 4/2005 | Stewart |
| 2005/0133084 | A1 | 6/2005 | Joge et al. |
| 2005/0194037 | A1 | 9/2005 | Asai |
| 2005/0221613 | A1 | 10/2005 | Ozaki et al. |
| 2005/0253308 | A1 | 11/2005 | Sherwood |
| 2006/0207650 | A1 | 9/2006 | Winston et al. |
| 2006/0231133 | A1 | 10/2006 | Fork et al. |
| 2006/0251796 | A1 | 11/2006 | Fellingham |
| 2006/0266235 | A1 | 11/2006 | Sandhu et al. |
| 2008/0047605 | A1 | 2/2008 | Benitez et al. |
| 2008/0138456 | A1 | 6/2008 | Fork et al. |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1351318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 5/1985 |
| JP | 02 187291 A | 7/1990 |
| JP | 2002111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," $31^{st}$ IEEE Photovoltaic Specialists Conf., Florida, 2005, pp. 1324-1327.

Fukui et al. "17.7% efficiency large area multicrystalline silicon solar cell using screen-printed metallization technique," $31^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "$Bi_2O_3$-$Wo_3$ compounds for photocatalytic applications by solid state and viscous processing", Title from a conference scheduled for Oct. 6-7, 2004 in Munich, 8 pages.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", $15^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Neuhaus et al. "Industrial Silicon Wafer Solar Cells," Advances in OptoElectronics, vol. 2007, 2007, 15 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Taguchi et al. An Approach for the Higher Efficiency in the HIT Cells, IEEE, pp. 866-871, 2005.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.html, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Benitez et al. "High-Concentration Mirror-Based Kohler Integrating System for Tandem Solar Cells", WCPEC2006, 4 pages.

Bett et al. "Flatcon™ and Flashcon™ Concepts for High Concentration PV", Presented at the $19^{th}$ European Photovoltaic Solar Energy Conf., Jun. 7-11, 2004, Paris, 4 pages.

Gordon et al. "Optical performance at the thermodynamic limit with tailored imaging designs", Applied Optics, *in press*, Dec. 2004, 16 pages.

Kenis et al. "Fabrication inside Microchannels Using Fluid Flow", Accounts of Chemical Research, vol. 33, No. 12, 2000, pp. 841-847.

Mulligan et al. "A Flat-Plate Concentrator: Micro-Concentrator Design Overview", 2000 IEEE, pp. 1495-1497.

Mulligan et al. "Development of Chip-Size Silicon Solar Cells".

Nguyen, Luu "Wafer Level Packaging for Analog/Mixed Signal Applications", MEPTEC Int. Wafer Level Packaging Conference, Aug. 22, 2002, 41 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Terao et al. "A Mirror-Less Design for Micro-Concentrator Modules", Conference Record of the 28$^{th}$ IEEE Photovoltaic Specialists Conference (2000) pp. 1416-1419.

Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

Bejan, Adrian "Chapter Five, Buckling Flows: A New Frontier in Fluid Mechanics", Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

\* cited by examiner

EXTRUSION HEAD WITH PLANARIZED EDGE SURFACE

FIELD OF THE INVENTION

The present invention is related to micro extrusion systems and methods, and more particularly to methods for fabricating extrusion heads for simultaneously producing a large number of relatively fine extruded structures.

BACKGROUND

With traditional extrusion a billet of material is pushed and/or drawn through a die to create a rod, rail, pipe, etc. Various applications leverage this capability. For instance, extrusion can be used with food processing applications to create pasta, cereal, snacks, etc., pipe pastry filling (e.g., meringue), pattern cookie dough on a cookie pan, generate pastry flowers and borders on cakes, etc. In another application, extrusion can be used with consumer goods, for example, to merge different colored toothpastes together on a toothbrush.

Micro extrusion involves the extrusion of fine featured (e.g., less than 50 micron width and height) structures on a target substrate. Extrusion heads for micro extrusion systems typically include metal plates that are laminated together using known high pressure wafer bonding techniques, with one or more of the plates being processed to define multiple fluidic channels that communicate with associated outlet orifices that are defined on an edge surface of the head. Extrusion material is inserted into fluidic channels through input ports such that the extrusion materials are shaped and extruded through outlet orifice, from which it is dispensed onto the target substrate.

Due to their fine structure, gridlines and other micro extruded structures produced by micro extrusion heads are extremely sensitive to variances in the fluidic channel shape and the distance of the outlet orifice from the substrate surface. In particular, most of the pressure drop typically occurs in the smallest and most constricted portions of the outlet and therefore variances in the outlet shape and distance can lead to a large variation in flow impedance for multiple orifice systems. Because the fluidic channels and outlet orifices are arranged in a relatively long line along the edge surface of the extrusion head, it is important that the edge surface of the extrusion head be as close to a perfect plane as possible. That is, slight imperfections in the head fabrication process that produce non-linearity along the edge surface, particularly at the outlet orifices, can result in non-optimal or even non-acceptable micro extruded structures.

Moreover, the methods used to form an extrusion head may introduce an unavoidable and often unpredictable shape change due to plastic deformation of the layers comprising the device, for example during high pressure bonding. Forming the orifices such that they have uniform flow impedance in situations where the orifice locations have shifted presents a fabrication challenge.

What is needed is an extrusion head for a micro extrusion system having a uniform orifice impedance such that the micro extruded structures formed by the extrusion head are consistent and reliable. What is also needed is a method for fabricating an extrusion head for micro extrusion systems that produces such a highly planarized edge surface.

SUMMARY OF THE INVENTION

The present invention is directed to an extrusion head for a micro extrusion apparatus that utilizes one or more precisely formed reference surfaces to facilitate the trimming of an edge surface of the extrusion head in order to provide a desired (e.g., planar) shape. The extrusion head is made up of sheets (e.g., metal plates) that are bonded together using high pressure bonding techniques to form a composite structure. Central sheets of the composite structure are etched prior to the bonding process to include inlet ports and cavities that form fluidic channels for extruding materials through associated outlet orifices onto the target substrate. In accordance with the present invention, the reference surfaces are etched into one or more of these central sheets using the same mask(s) that are used to form the cavities/inlet ports. After the bonding process and an optional dicing process, side edges of the various sheets form an edge surface of the composite extrusion head, where the outlet portions of the cavities form spaced-apart outlet orifices in the edge surface, and the reference surfaces are disposed in spaced apart indentations (notches) that are also defined in the edge surface. Due to the assembly process, the edge surface of the extrusion head is initially non-planar, and requires a subsequent trimming process to achieve the desired extrusion head performance. In accordance with an aspect of the present invention, trimming of the edge surface is performed using the reference surfaces as a precise guide; that is, material is removed (e.g., by grinding or other abrasion process) until each of the reference surfaces is located a predetermined distance from the edge surface. By defining and using the reference surfaces in this manner, extrusion heads are produced, for example, with precisely planar edge surfaces, whereby all of the outlet orifices defined on the edge surface can be reliably uniformly positioned over a target substrate during a subsequent micro extrusion process to avoid production problems associated with conventional methods.

In accordance with an embodiment of the present invention, a micro extrusion apparatus is used for forming closely spaced high-aspect ratio gridline structures on a substrate surface in which the gridlines are co-extruded with a sacrificial material onto the substrate surface such that the high-aspect ratio gridline is supported between two sacrificial material portions (the sacrificial portions are subsequently removed). The formation of such co-extruded structures requires the compression of the gridline material between the two sacrificial material portions, which requires the use of a relatively wide three-part fluidic channel feeding a relatively narrow outlet orifice in a manner that compresses the gridline material between the two sacrificial material portions. Due to the width of the three-channel cavity, the spacing between adjacent outlet orifices on each head (and, hence, the pitch of the extruded gridlines) is larger than the size of each outlet orifice (i.e., a relatively large space is provided between adjacent outlet orifices on the co-extrusion head). According to the present invention, the relatively wide spacing between adjacent outlet orifices is utilized to provide a series of reference surfaces such that each outlet orifice is located between two associated reference surfaces on the edge surface of the co-extrusion head. The multiple, relatively uniformly spaced reference surfaces, each precisely etched to define a straight line that is parallel to the desired planar edge surface, facilitate precise planarization of the edge surface.

In accordance with another embodiment of the present invention, multiple co-extrusion heads are manufactured together by etching rows of fluidic channels and feed channels on a set of sheets, where each row of etched features corresponds to an associated co-extrusion head of the multiple heads. The etched sheets are bonded to form a multi-head block, which is then diced to form individual co-extrusion heads. In this embodiment, the outlet portion of each cavity (i.e., fluidic channel) includes a T-shaped opening, where the fluidic channel forms the central vertical portion of the T-shaped opening, and the reference surfaces are formed at lower ends of the bars that extend downward from the upper horizontal bar of the T-shaped opening. The T-shaped openings associated with the multiple fluidic channels of the extrusion head are arranged such that the upper horizontal bars of the T-shaped openings define a straight line. When the multi-head block is subsequently diced (i.e., separated into individual extrusion heads), the dicing cut is directed along the straight line defined by the upper horizontal bars of the T-shaped openings. Therefore, the dicing cuts expose the edge surface of each extrusion head, with each roughly-cut edge surface including a long line of outlet orifices and reference surfaces disposed on opposite sides of each outlet orifice. The roughly-cut edge surface of the composite structure is then subjected to planarization, for example, by grinding and/or polishing, during which the reference surfaces are used to control the amount of material that is removed, thus resulting in a highly precise planarized edge surface that facilitates the production of fine extruded structures. Therefore, forming the multi-headed blocks with a large number of the T-shaped openings described above facilitates the economic and reliable fabrication of extrusion heads having highly planarized edge (outlet) surfaces.

BRIEF DESCRIPTION OF THE DRAWINGS

These and other features, aspects and advantages of the present invention will become better understood with regard to the following description, appended claims, and accompanying drawings, where:

DETAILED DESCRIPTION

Figure 1:
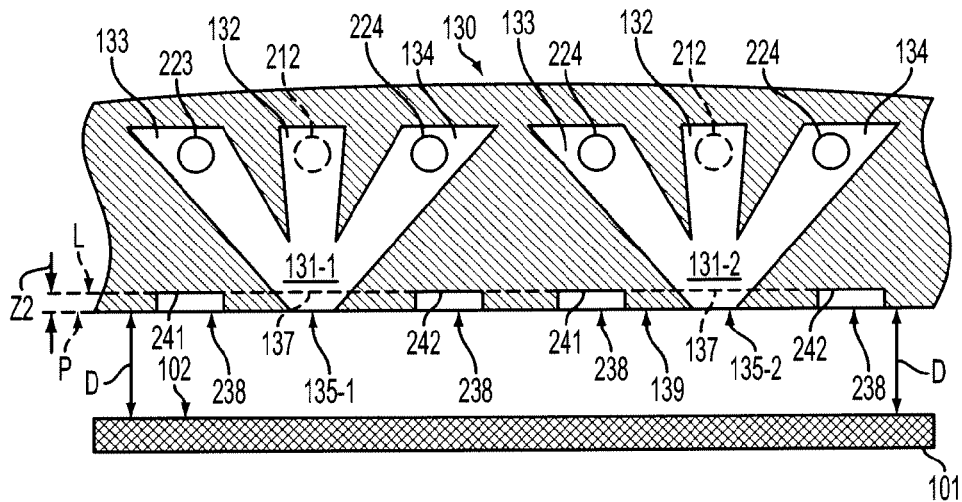
FIG. 1 is cross-sectional view showing a portion of a co-extrusion head for a micro extrusion apparatus according to an embodiment of the present invention.

FIG. 1 illustrates a portion of an extrusion head 130, which makes up part of a micro extrusion apparatus for producing extruded structures on a substrate 101 in accordance with an embodiment of the present invention. As set forth in additional detail below, extrusion head 130 includes multiple sheets (e.g., metal plates) that form multiple fluidic channels (e.g., fluidic channels 131-1 and 131-2) that extrude material through associated outlet orifices (e.g., outlet orifices 135-1 and 135-2) that are arranged along an edge surface 139 (shown in edge view in FIG. 1). Each fluidic channel (e.g., fluidic channel 131-1) includes a central channel 132 positioned between opposing (first and second) side channels 133 and 134, with all three channels communicating with associated outlet orifice 135-1 by way of an output junction (output portion) 137. Each central channel 132 has a substantially isolated inlet end and an opposing outlet end that coincides with output junction 137. Similarly, side channels 133 and 134 have substantially isolated inlet ends, and are angled toward central channel 132 such that their respective outlet ends converge at output junction 137. As described below, extrusion materials enter the inlet ends of each channel 132, 133 and 134 through inlet ports 212, 223 and 224, respectively, travel along the respective channels to junction region 137, and exit fluidic channels 131-1 and 131-2 through outlet orifices 135-1 and 135-2, respectively. Although the disclosed embodiment depicts three intercommunicating channels arranged in an arrowhead shape, aspects of the present invention apply to fluidic channels having any number of straight-line branches (e.g., one single straight channel communicating with each outlet orifice).

In accordance with the present invention, extrusion head 130 includes multiple reference surfaces (e.g., reference surfaces 241 and 242) that define a straight line L that is parallel to a plane P defined by edge surface 139. The straight line L defined by reference surfaces 241 and 242 intersects output junction 137 of each extrusion fluidic channel 131-1 and 131-2. In accordance with an aspect of the present invention, reference surfaces 241 and 242 are disposed inside indentations (notches) 238 such that each reference surface 241 and 242 is located a predetermined distance Z2 from plane P. As described below, producing reference surfaces 241 and 242 in this arrangement facilitates reliable and highly precise planarization of edge surface 139.

Figure 2:
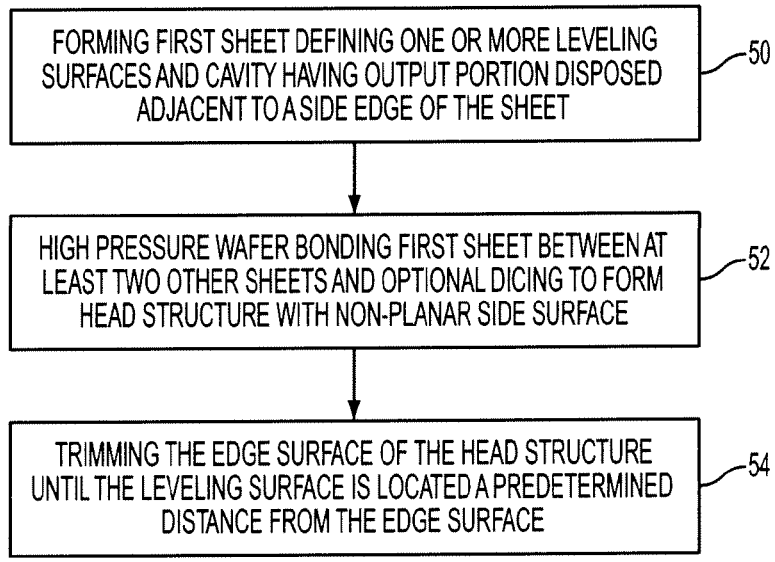
FIG. 2 is a flow chart depicting a generalized process for producing the co-extrusion head of FIG. 1 according to an embodiment of the present invention.

FIG. 2 is a flow diagram depicting a generalized process for producing extrusion heads according to an embodiment of the present invention. The generalized process is described below with reference to FIGS. 3 and 4, which illustrate an exemplary embodiment that is consistent with extrusion head 130 of FIG. 1.

Figure 3:
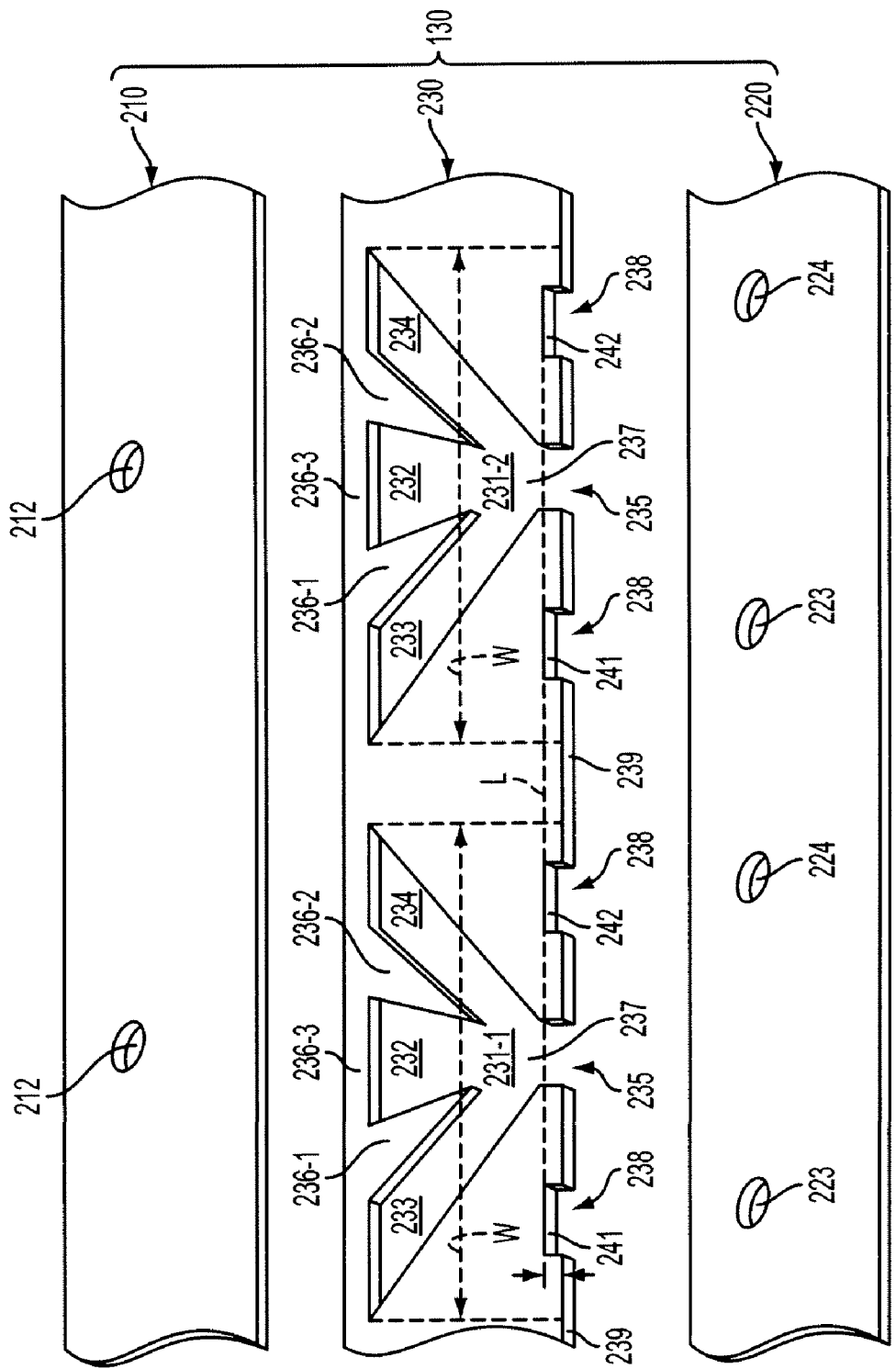
FIG. 3 is an exploded perspective view showing the portion of the co-extrusion head of FIG. 1.

Referring to the upper block 50 of FIG. 2 and to FIG. 3, the process for producing extrusion head 130 begins by forming a (first) sheet (e.g., a metal plate) 230 and opposing (second and third) sheets 210 and 220 such that the sheet material defines multiple extrusion cavities 231-1 and 231-2, multiple reference surfaces 241 and 242 and associated inlet portions 212, 223 and 224. In one embodiment, sheets 210, 220 and 230 are metal plates having a thickness of approximately 0.075 to 0.150 mm, and the forming process involves a micro machining procedure such as photochemical machining. In the disclosed embodiment, the sheet material includes an end structure 236-3, and each extrusion cavity 231-1 and 231-2 is defined by an arrowhead-shaped opening including a central cavity 232 and opposing (first and second) side cavities 233 and 234. Central cavity 232 is separated from side cavity 233 by a first tapered finger 236-1, and is separated from side cavity 234 by a second tapered finger 236-2. Each central cavity 232 has a closed end that is defined by end structure 236-3 and tapered fingers 236-1 and 236-2, and an open end that coincides with a junction region 237, and communicates with an opening 235 defined in a side edge 239 of sheet 230. Similarly, side cavities 233 and 234 have associated closed ends that are defined by end structure 236-3 and tapered fingers 236-1 and 236-2, and are angled toward central cavity 232 such that their respective open ends that communicate with opening 235 by way of junction region 237. Reference surfaces 241 and 242 are disposed in notches 238 that are defined in side edge 239, and define straight line L that intersects an junction region 237 of extrusion cavities 231-1 and 231-2. Note that, prior to the planarizing process described below, reference surfaces 241 and 242 may be disposed a relatively large distance Z1 from side edge 239.

Because side cavities 233 and 234 are tapered toward opening 235, each extrusion cavity 231-1 and 231-2 has an effective width W that is substantially larger than opening 235. Accordingly, the spacing between adjacent openings 235 along side edge 239 is relatively large. That is, the distance between extruded structures produced by extrusion head 130 is limited by the effective width W required for each three-part extrusion cavity 231-1 and 231-2. In accordance with another aspect of the present invention, to make efficient use of the portions of side edge 239 between output openings 235, reference surfaces 241 and 242 are disposed within the effective width W defined by each extrusion cavity 231-1 and 231-2. As described below, the level of precision achieved during the planarization process is proportional to the number of reference surfaces 241 and 242 and their relative position to each outlet orifice. By positioning reference surfaces 241 and 242 within the effective width W defined by each extrusion cavity 231-1 and 231-2, the number of reference surfaces can be maximized without increasing the pitch between adjacent outlet orifices.

In addition to forming central sheet 230 in the manner described above, additional sheets 210 and 220 are also formed to provide inlet openings that communicate with the closed ends of each cavity section. For example, upper sheet 210 defines first inlet ports (through holes) 212, and lower metal plate 220 defines second and third inlet ports 223 and 224. Inlet ports 212, 223 and 224 are formed, for example, using the same micro-machining techniques used to form extrusion cavities 231-1 and 231-2. As indicated below, after assembly, inlet port 212 aligns with the closed end of central cavity 232, and inlet ports 223 and 224 align with the closed ends of side cavities 233 and 234, respectively.

Figure 4:
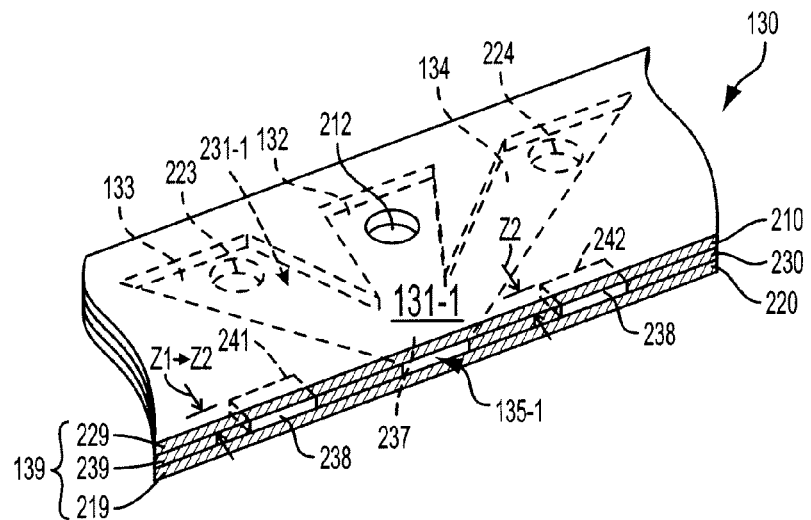
FIG. 4 is an assembled perspective view showing a portion of the co-extrusion head of FIG. 1.

Referring to block 52 of FIG. 2 and to FIG. 4, extrusion head 130 is then assembled by securing central metal plate 230 between upper metal plate 210 and lower metal plate 220. FIG. 4 is an assembled perspective view showing extrusion head 130 after assembly is completed. In accordance with an embodiment of the present invention, the securing process involves bonding the sheets together using known high pressure wafer bonding techniques to form the substantially solid, block-like structure shown in FIG. 1. Note that extrusion cavity 231-1 and corresponding portions of plates 210 and 220 combine to form an associated fluidic channel 131-1, which is made up of a central channel 132 and opposing side channels 133 and 134 that are arranged in the manner described above with respect to cavity portions 232, 233 and 234. Note also that side edges 219, 229 and 239 of plates 210, 220 and 230, respectively, combine to form edge surface 139 of extrusion head 130. As described in greater detail below, extruded materials are injected into fluidic channel 131-1 through inlet ports 212, 223 and 224, and the injected materials pass along channels 132, 133 and 134 to outlet orifice 135-1, which is defined in edge surface 139. Finally, portions of upper plate 210 and lower plate 220 cover side portions of notches 238, thereby forming indentations defined in edge surface 139 through which reference surfaces 241 and 242 are offset from edge surface 139 by an initial distance Z1.

Referring to block 54 of FIG. 2 and again to FIG. 4, edge surface 139 is then subjected to a planarizing process during which material is removed until the edge surface 139 is substantially planar and each reference surface 241 and 242 is separated from edge surface 139 by a predetermined distance Z2. The nozzle-depth leveling (machining) process may be performed, for example by performing a wire electro-discharge machining (wire EDM) operation guided by depth information between edge surface 139 and reference surfaces 241 and 242. Alternative machining processes include but are not limited to etching, stamping, and laser ablation.

In addition to the laminated metal layer arrangement depicted in FIGS. 3 and 4, extrusion head 130 can be manufactured a variety of ways. In another embodiment, an extrusion head formed in accordance with the present invention can be manufactured by brazing together layers of etched sheet metal. In yet another instance, the heads can be manufactured by generating structures out of photo-definable polymer such as SU8. Moreover, in addition to the specific gridline structures described herein, extrusion head 130 may be modified to produce gridline structures having an equilibrium shape, as described in co-owned and co-pending U.S. patent application Ser. No. 11/555,496, entitled "EXTRUDED STRUCTURE WITH EQUILIBRIUM SHAPE", which is incorporated herein by reference in its entirety.

Figure 5:
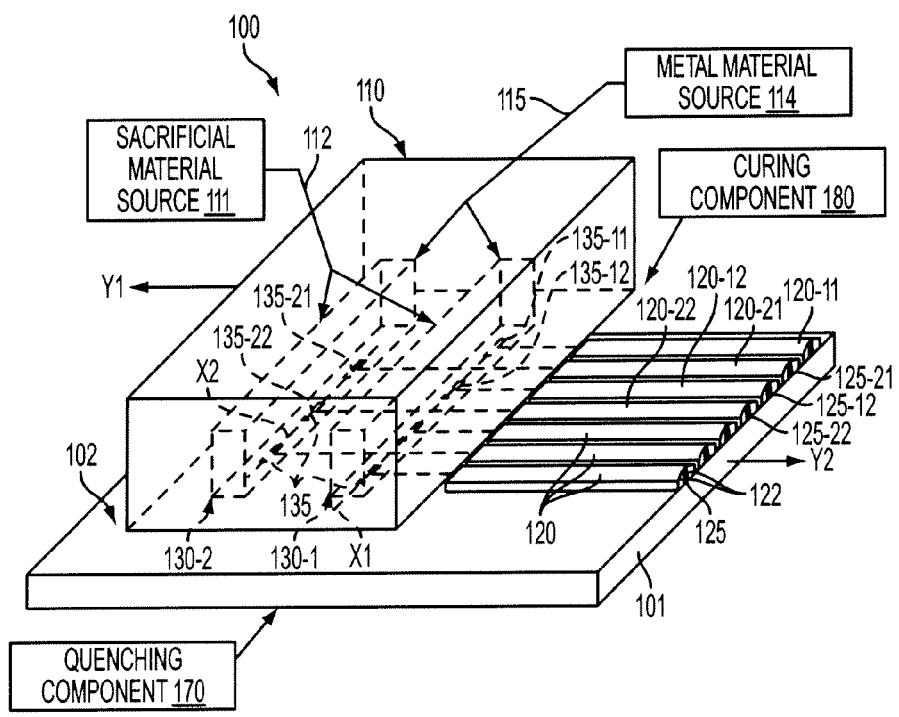
FIG. 5 is a perspective view showing a micro extrusion apparatus including the co-extrusion head of FIG. 1 for concurrently applying two or more materials on a substrate.

FIG. 5 illustrates micro extrusion apparatus 100 in accordance with another embodiment of the present invention. Apparatus 100 includes an extrusion device 110 having one or more co-extrusion heads 130-1 and 130-2 fixedly mounted thereon, each co-extrusion head 130-1 and 130-2 being consistent with extrusion head 130, described above. In the present embodiment, extrusion device 110 is coupled to a first source 111 containing a sacrificial material 112, and a second source 114 containing a gridline material 115. Extrusion heads 130-1 and 130-2 are operably coupled to sources 111 and 114 such that heads 130-1 and 130-2 concurrently apply sacrificial material 112 and a gridline material 115 onto upper surface 102 of substrate 101. The materials are applied through pushing and/or drawing techniques (e.g., hot and cold) in which the materials are pushed (e.g., squeezed, etc.) and/or drawn (e.g., via a vacuum, etc.) through extrusion device 110 and/or co-extrusion heads 130-1 and 130-2, and out outlet orifices 135 that are respectively defined in a lower portion of co-extrusion heads 130-1 and 130-2.

In one embodiment, co-extrusion heads 130-1 and 130-2 are held by extrusion device 110 such that their respective outlet orifices 135 are arranged in a parallel, spaced-apart arrangement. In particular, the (first) outlet orifices of co-extrusion head 130-1 (e.g., outlet orifices 135-11 and 135-12) extending in a first direction X1, and the (second) outlet orifices of the second co-extrusion head 130-2 (e.g., outlet orifices 135-21 and 135-22) define a second line X2 that is separated from and parallel to first line X1. As set forth in co-pending U.S. patent application Ser. No. 11/555,479, entitled "CLOSELY SPACED, HIGH-ASPECT EXTRUDED GRIDLINES", which is incorporated herein by reference in its entirety, apparatus 100 includes a mechanism (not shown) for moving extrusion device 110 (and, hence, co-extrusion heads 130-1 and 130-2) in a direction that is perpendicular to the alignment direction of the outlet orifices, and gridline material 112 and sacrificial material 115 are co-extruded through outlet orifices 135 in a manner that creates parallel, elongated extruded structures 120 on substrate 101 such that the gridline material of each structure 120 forms a high-aspect ratio gridline structure 125, and the sacrificial material of each structure 120 forms associated first and second sacrificial material portions 122 respectively disposed on opposing sides of the associated high-aspect ratio gridline 125. The shape of extruded structures 120 (i.e., the aspect ratio of gridline 125 and the shape of sacrificial portions 122) are controlled by the shape outlet orifices 135 and the fluidic channels inside heads 130-1 and 130-2, characteristics of the materials (e.g., viscosity, etc.), and the extrusion technique (e.g., flow rate, pressure, temperature, etc.). Suitable gridline materials 115 include, but are not limited to, silver, copper, nickel, tin, aluminum, steel, alumina, silicates, glasses, carbon black, polymers and waxes, and suitable sacrificial materials 112 include plastic, ceramic, oil, cellulose, latex, polymethylmethacrylate etc., combinations thereof, and/or variations thereof, including combining the above with other substances to obtain a desired density, viscosity, texture, color, etc. The outlet orifices of co-extrusion heads 130-1 and 130-2 are disposed in a staggered arrangement to simultaneously generate extrusion structures 120A that are closely spaced, thus facilitating the production of high aspect-ratio gridlines 125 are formed on substrate 101 at a pitch that is not possible using conventional methods. In another embodiment of the present invention, a single head may be used to produce extrusion structures 120 that are spaced relatively far apart.

To limit the tendency for the materials to intermix after extrusion, extruded structures 120 leaving extrusion heads 130-1 and 130-2 can be quenched on substrate 101 by cooling the substrate using, for example, a quenching component 170. Alternately, the ink/paste used in this application may be a hot-melt material, which solidifies at ambient temperatures, in which case the printheads 130-1 and 130-2 are heated, leaving the extruded structures 120A to solidify once they are dispensed onto the substrate 101. In another technique, the materials can be cured by thermal, optical and/or other means upon exit from extrusion heads 130-1 and 130-2. For example, a curing component 180 can be provided to thermally and/or optically cure the materials. If one or both materials include an ultraviolet curing agent, the material can be bound up into solid form in order to enable further processing without mixing.

Figure 6A:
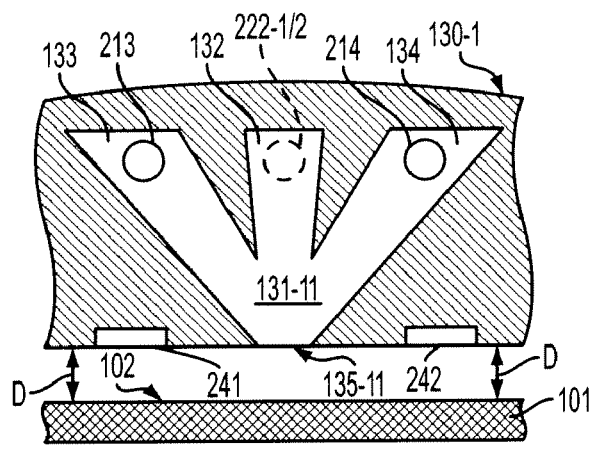
FIGS. 6(A) and 6(B) are cross-sectional side views showing a three-part fluidic channel defined in the co-extrusion head of FIG. 1.

FIG. 6(A) shows a portion of co-extrusion head 130-1 including fluidic channel 130-11 positioned over substrate 101 prior to generation of metal gridlines. Due to the precise planarization of edge surface 139 that is afforded by reference surfaces 241 and 242, co-extrusion head 130-1 is maintained at a substantially fixed distance D over upper surface 102 of substrate 101 during the extrusion process (i.e., while co-extrusion head 130-1 is moved relative to substrate 101 in the manner described above). The distance D between the head 130-1 and the substrate 101 can be based on various factors, such as the angle of the dispensing end of the head 130-1 with respect to upper surface 102 (e.g., from parallel to perpendicular), in order to increase transfer efficiency, entity definition (e.g., width, height, length, diameter, etc), entity characteristics (e.g., strength, pliability, etc.), etc. Note that distance D must be greater than or equal to the height H (shown in FIG. 7) of extruded structure 120-11 in order to facilitate the staggered extrusion head arrangement shown in FIG. 5.

Figure 6B:
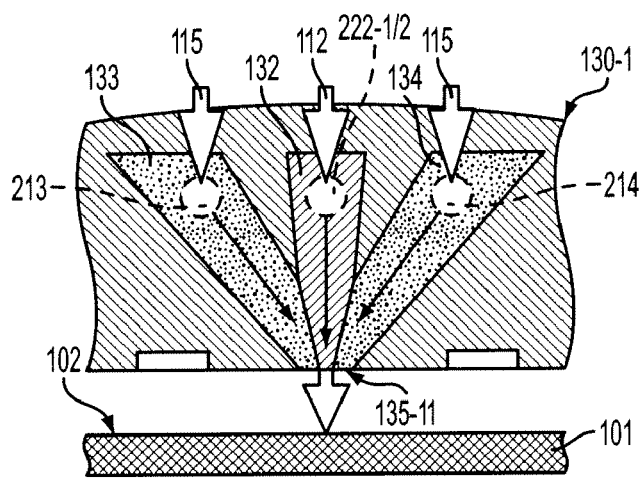

FIG. 6(B) shows the same portion of co-extrusion head 130-1 at the onset of the co-extrusion process. As indicated by the white arrows, gridline material 112 is forcibly injected through the first inlet ports 212 (see FIG. 3) into the closed end of central channel 132, and sacrificial material 115 is simultaneously forcibly injected through inlet ports 223 and 224 into side channels 133 and 134, respectively. As indicated by the dark arrows in FIG. 6(B), the injected materials travel downward along their respective channels. The gridline and sacrificial materials are compressed by the tapered shapes of channels 132, 133 and 134. The gridline material is further compressed by the converging sacrificial material flowing along side channels 133 and 134 as the materials approach outlet orifice 135-11. The compressed flow is then extruded from outlet orifice 135-11 and is deposited on substrate 101 as extruded structure 120-11 (shown in FIG. 7). Intermixing between the gridline and sacrificial materials is minimized by choosing appropriate materials and viscosities, by appropriately tapering the channels, and/or by maintaining laminar flow conditions.

Figure 7:
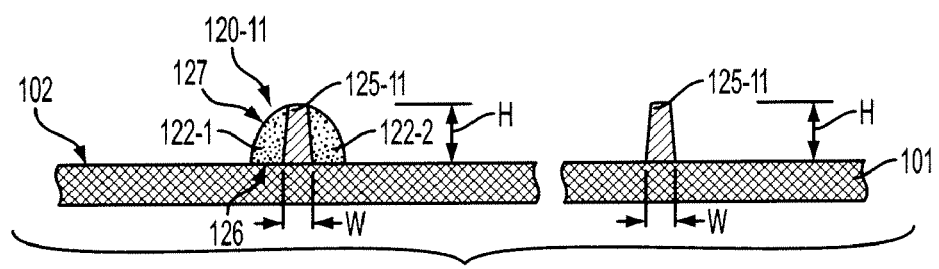
FIG. 7 is a cross-sectional side view showing an exemplary co-extruded gridline structure that was generated on a substrate surface by the co-extrusion head of FIG. 6(B)

FIG. 7 is a cross-sectional side view showing an exemplary extruded structure 120-11 produced in accordance with the co-extrusion process described with reference to FIG. 6(B). Extruded structure 120-11 includes a gridline 125-11 disposed between sacrificial support material portions 122-1 and 122-2. Due to the converging forces generated by three-branch fluidic channel 130-11 (FIGS. 6(A) and 6(B)) leading to outlet orifice 135-11, extruded structure 120-11 includes gridline 125-11 having an aspect ratio (height H to width W) of 2:1 or greater in a single pass, which is not possible using conventional methods. The width W of gridline 125-11 can be made narrower (finer) than the smallest minimum design feature of extruder head 130-11. Sacrificial material portions 122-1 and 122-2 retain the high-aspect ratio shape of gridline 125-11 as long as needed before or during subsequent processing such as drying, curing, and/or sintering. As shown on the right side of FIG. 7, the sacrificial portions are then removed, thus providing high aspect-ratio gridline 125-11 with the desired height H and width W. A further advantage of sacrificial material portions 122-1 and 122-2 is that the added material leads to an overall larger outlet orifice 135-11, and hence a lower pressure drop for a given material flow speed. Higher process speed is therefore achievable. In addition, the compressing flow can be manipulated to form metal gridline 125-11 with a tapered cross-section (e.g., with a relatively wide base disposed on substrate surface 102, a relatively narrow upper end, and tapered sides that extend at an angle relative to surface 102 from the base end to the upper end). This tapered shape facilitates directing photons into substrate 101, and reduces the photon blocking (shading) caused by the gridlines, which can improve efficiency and/or generation of electrical power.

Figure 8:
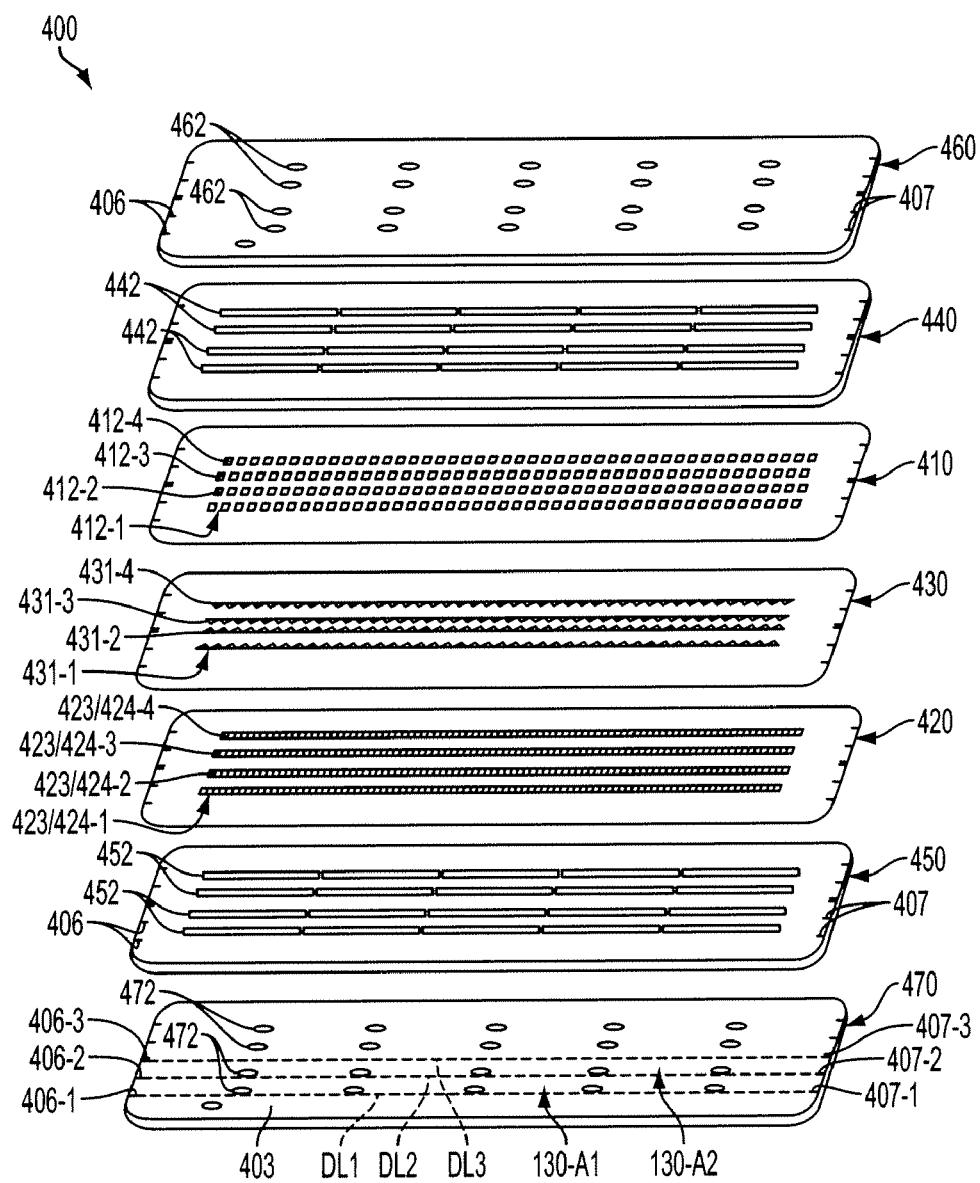
FIG. 8 is an exploded perspective view showing a set of metal plates utilized to produce multiple co-extrusion heads according to another embodiment of the present invention.

FIG. 8 is an exploded perspective view showing a set of metal plates 410-470 utilized to produce multiple co-extrusion heads according to another embodiment of the present invention. Metal plates 410, 420 and 430 are shown in the central region of FIG. 8, and provide extrusion cavities and inlet ports similar to those described above, but arranged in rows that are associated with the individual co-extrusion heads produced upon dicing. For example, metal plate 430 includes rows of extrusion cavity 431-1 to 431-4, each row being associated with an associated co-extrusion head. Similarly, metal plates 410 and 420 include rows of inlet channels/ports 412-1 to 412-4 and 422-1 to 422-4 that are aligned with corresponding extrusion cavity rows 431-1 to 431-4 in the manner described below. Metal plates 440 and 450 are mounted onto metal plates 410 and 420, respectively, and include rows of feed channels 442 and 452, which facilitate flow of extrusion material to a predetermined number of inlet ports formed on metal plates 410 and 420, respectively. Outer plates 460 and 470 are mounted onto metal plates 440 and 450, respectively, and include rows of input openings 462 and 472, which facilitate flow of extrusion material to corresponding feed channels on metal plates 440 and 450, respectively.

In accordance with an embodiment of the present invention, plates 410-470 are aligned using known techniques and stacked as shown, and then subjected to a high pressure bonding process to produce a multi-head block 400, which is then diced to produce four co-extrusion heads. In an alternative embodiment using plastic plates, the bonding process is performed using an adhesive. Each plate 410-470 includes dicing notches 406 and 407 that are formed at each end of each plate 410-470 to facilitate accurate dicing (cutting) of the bonded block along lines extending between corresponding dicing notches 406 and 407. For example, as indicated at the bottom of FIG. 10, a dicing line DL1 is indicate in dashed lines between dicing notches 406-1 and 407-1. In this manner, block 400 is accurately and reliably diced into (e.g., four) co-extrusion heads. For example, block 400 is diced along dice line DL1 and DL2 (which extends between dicing notches 406-1 and 407-1) to produce a first co-extrusion head 130-A1 (note that only the lowermost layer of co-extrusion head 130-A1 is indicated by the dashed lines in FIG. 8, and that co-extrusion head 130-A1 includes corresponding portions of each metal plate, including extrusion cavity row 431-1 and inlet port rows 412-1 and 422-1). A similar dicing cut along dice line LD3 (between dicing notches 406-3 and 407-3) produces another co-extrusion head 130-A2. Note that end sections 403 of block 400 are discarded after the dicing is performed.

Figure 9:
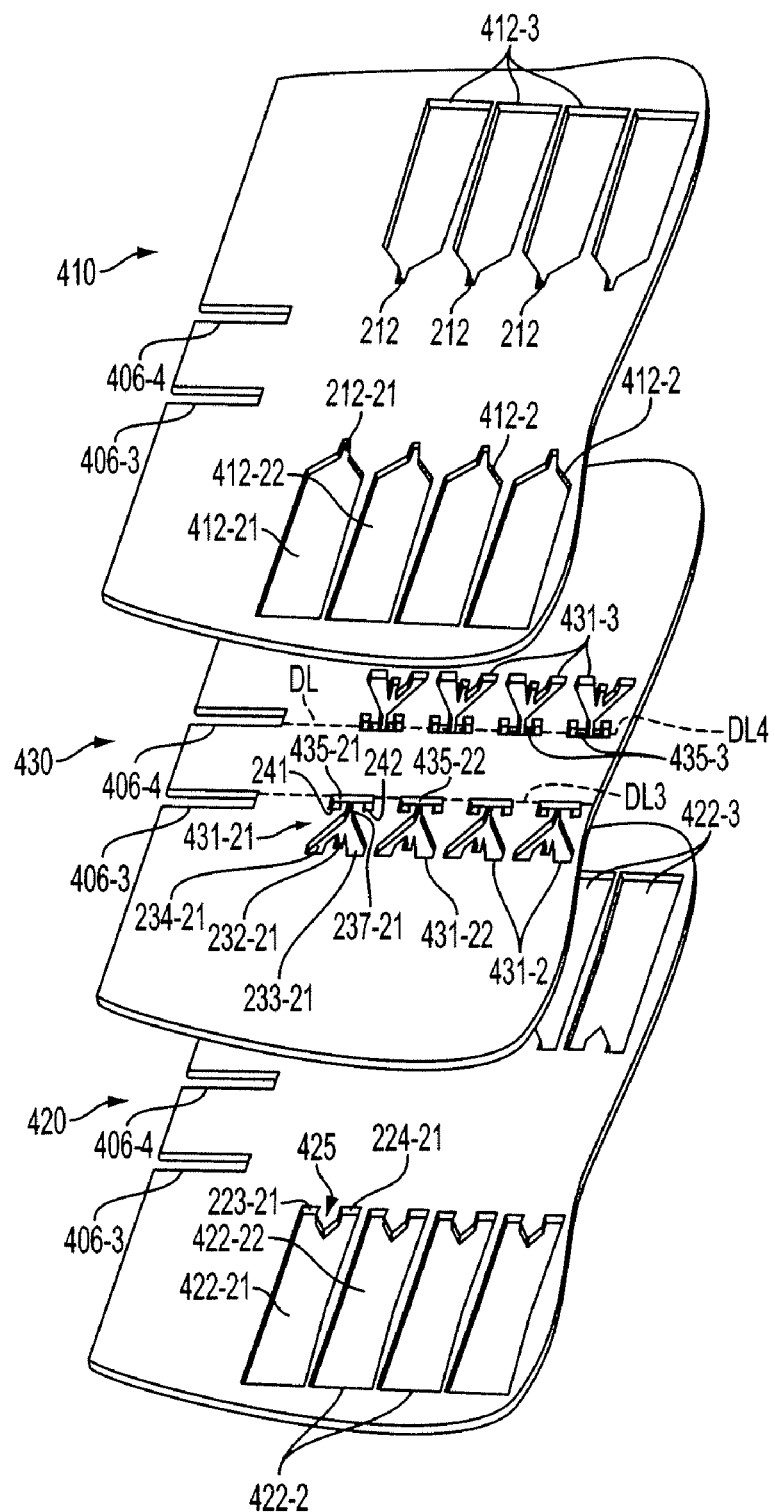
FIG. 9 is an exploded perspective view showing three central metal plates of the metal plate set of FIG. 8 in additional detail.

FIG. 9 is an exploded perspective view showing portions of metal plates 410, 420 and 430 in additional detail. Each plate includes dicing notches 406-3 and 406-4, which are formed in a side edge of each plate and are aligned vertically during and after the bonding process, and facilitate dicing in the direction indicated by the dashed dicing lines DL indicated on plate 430. Plates 410 and 420 include rows of inlet channels and associated inlet ports located at the end of each inlet channel that function in a manner similar to that described above. In particular, plate 410 includes a first row of inlet channels 412-21 and a second row of inlet channels 412-22, each feed channel having an inlet port 212 disposed at a tapered end thereof (e.g., inlet channel 412-21 includes an inlet port 212-21). Similarly, plate 420 includes rows of inlet channels 412-21 and 412-22, with each inlet channel having two inlet ports 223 and 224 disposed at an end thereof (e.g., inlet channel 422-21 includes inlet ports 223-21 and 224-21 that are separated by a tapered structure 425). Central plate 410 includes rows of arrowhead-shaped extrusion cavities 431-2 and 431-3 that are aligned to receive extrusion materials from associated inlet ports in the manner described above. For example, extrusion cavities 431-21 includes a central cavity 232-21 for receiving a first extrusion material from inlet portion 212-21, and side cavities 233-21 and 234-21 for receiving a second extrusion material from inlet portions 223-21 and 224-21.

Figure 10A:
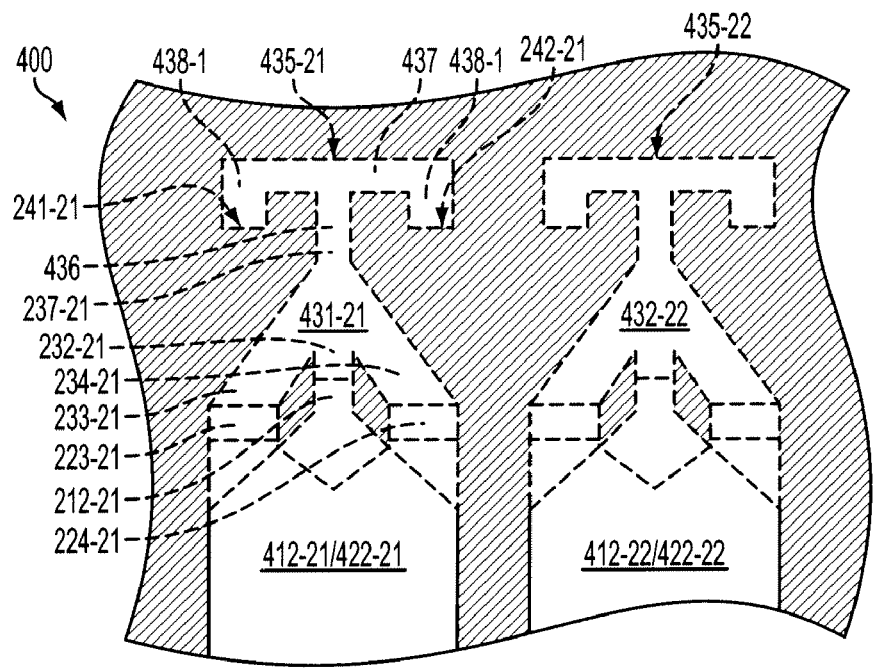
FIGS. 10(A), 10(B), 10(C) and 10(D) are cross-sectional views showing a portion of a multi-head block formed by bonding the metal plate set of FIG. 8, and depict dicing and subsequent planarization of the edge surface according to an embodiment of the present invention.

In accordance with another aspect of the present invention, each extrusion cavity 431-2 and 431-3 includes a T-shaped opening 435-2 and 435-3 that communicates with the junction region of the associated extrusion cavity and includes reference surfaces formed at outer portions thereof. For example, as indicated in FIGS. 9 and 10(A), extrusion cavity 431-21 includes a T-shaped opening 435-21 that has a central (vertical) portion 436 extending in line with central cavity 232-21 and junction region 237-21, an upper (horizontal) portion 437 extending perpendicular to vertical portion 436, and short bar portions 438-1 and 438-2 located at each end of the upper portion. Note that the use of "vertical", "horizontal", "upper" and other directional terms are intended to be read in the context of an idealized orientation of the T-shaped openings, and not based on an absolute frame of reference. Reference surfaces 241-21 and 242-21 are formed at lower ends of bar portions 438-1 and 438-2, respectively.

Figure 10B:
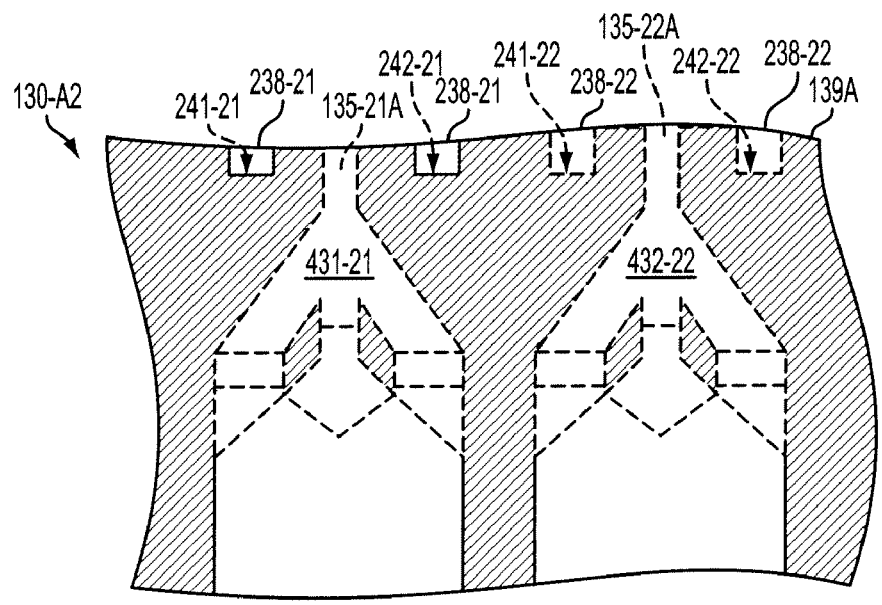
Figure 10C:
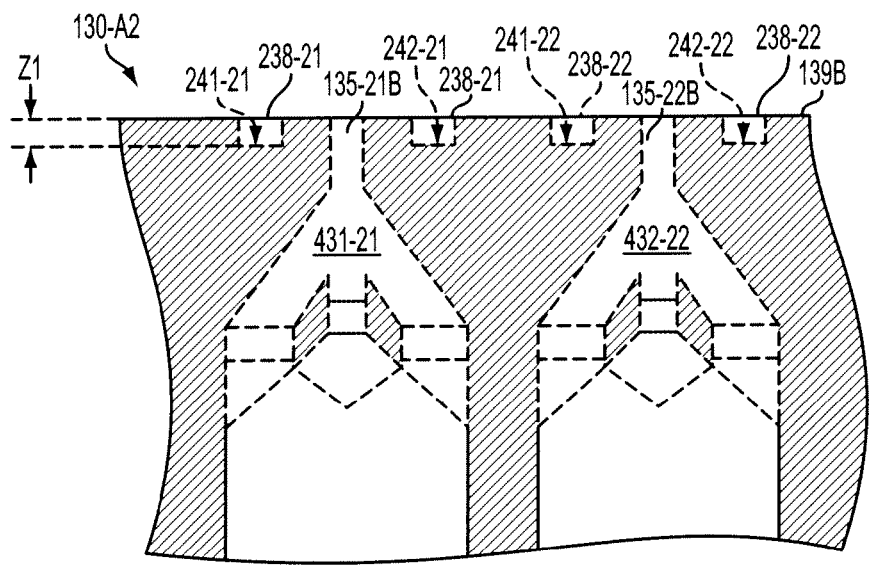
Figure 10D:
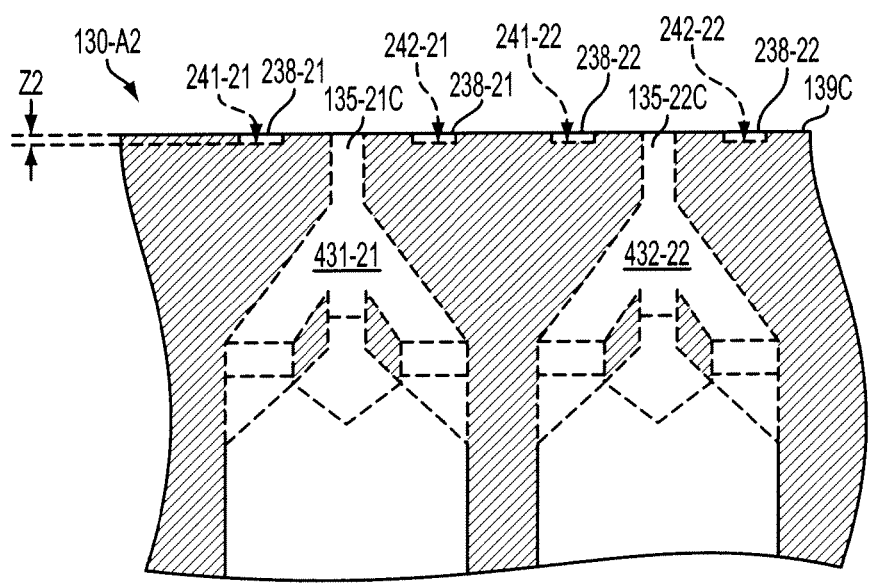

According to another aspect of the present invention, as indicated in FIG. 9, T-shaped openings 435-2 and 435-3 are arranged such that the upper horizontal portions (i.e., portions 437; see FIG. 10(A)) of each T-shaped opening defines straight lines that coincide with dice lines DL3 and DL4, respectively, which in turn are aligned with dicing notches 406-3 and 406-4, respectively. As indicated in FIG. 10(B), which shows a portion of extrusion head 130-2 after dicing is performed, the dicing cut extends along the line formed by the upper horizontal portions such that the roughly cut edge surface 139A includes indentations 238-21 and 238-22, and outlet orifices 135-21A and 135-22A, which are similar to those described above. As indicated in FIGS. 10(C) and 10(D), the edge surface 139B is then subjected to trimming (planarizing) during which material is gradually removed until the depth of indentations 238-21 and 238-22 is reduced from Z1 to the desired distance Z2. This planarization process is performed, for example, by grinding and/or polishing block material while using reference surfaces 241-21, 242-21, 241-22 and 242-22 to control the amount of material that is removed, thus resulting in a highly precise planarized edge surface 139C that facilitates the production of fine extruded structures.

Figure 11:
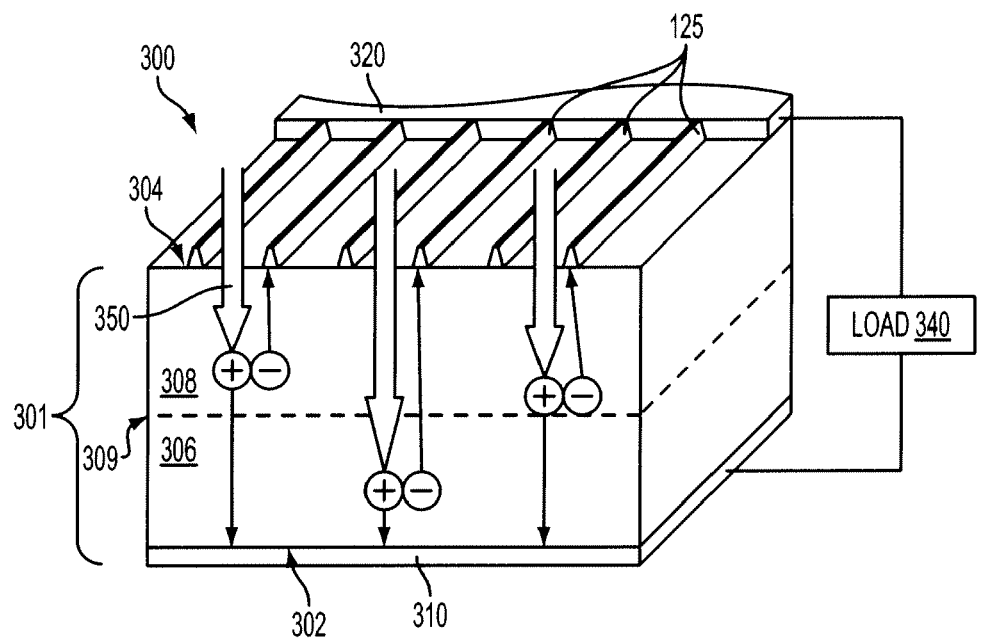
FIG. 11 illustrates a photovoltaic cell including gridlines formed in accordance with the present invention.

FIG. 11 illustrates an exemplary portion of a photovoltaic cell 300, such as a solar cell, with high-aspect metal gridlines 125 created via co-extrusion head 130 according to an embodiment of the present invention. Photovoltaic cell 300 includes a semiconductor substrate 301 with a p-type region 306 and an n-type region 308. One or both of the regions 306 and 308 of substrate 301 is formed from semiconductor materials such as, for example, Aluminum Arsenide, Aluminum Gallium Arsenide, Boron Nitride, Cadmium Sulfide, Cadmium Selenide, Copper Indium Gallium Selenide, Diamond, Gallium Arsenide, Gallium Nitride, Germanium, Indium Phosphide, Silicon, Silicon Carbide, Silicon Germanium, Silicon on insulator, Zinc Sulfide, Zinc Selenide, etc. A lower contact 310 is formed on a lower surface 302 of substrate 301 (i.e., at a lower end of p-type region 306). Metal gridlines 125 and one or more bus bars 320 are formed on an upper surface 304 of substrate 301 (i.e., at a lower end of n-type region 308). Contact 310 and bus bars 320 can be formed using a metal paste such as a silver or an aluminum based paste.

Photovoltaic cell 300 can be interconnected with other photovoltaic cells (not shown) in series and/or parallel, for example, via flat wires or metal ribbons, and assembled into modules or panels and connected as indicated to a load 340. A sheet of tempered glass (not shown) may be layered over the gridlines 125 and/or a polymer encapsulation (not shown) may be formed over the contact 310. Upper surface 304 may include a textured surface and/or be coated with an antireflection material (e.g., silicon nitride, titanium dioxide, etc.) in order to increase the amount of light absorbed into the cell.

During operation, when photons 350 (indicated by wide arrows) are directed into substrate 301 through upper surface 304, their energy excites electron-hole pairs therein, which subsequently freely move. In particular, absorption of a photon creates an electric current through the p-n junction (depicted by the migrating + and − charges). Electrical current is generated when excited electrons in the n-type region 308 travel through gridlines 125, bus bar 320, and the electrodes to external load 340 and back through the lower electrode and contact 310 to the p-type region 306.

By way of example, a co-extrusion head with the estimated parameters illustrated in Table 1 could be used to dispense the materials to make gridlines 125 on a crystalline silicon solar cell.

TABLE 1

Exemplary head parameters for generating a gridline.

| | |
|---|---|
| Sheet Thickness | 152 microns |
| Gridline Pitch | 2.5 mm |
| Head Speed | 1 cm/sec |
| Past Viscosity | 100,000 Cp |
| Head Angle | 45 degrees |
| Head Exit Width | 304.8 Microns |
| Silver Width | 49.2 microns |
| Silver Line Cross Section | 7,500 microns^2 |
| Silver Line Aspect Ratio | 3.10:1 |
| Silver Flow | 0.075 mm^3/sec |
| Head Compression | 6.2:1 |
| Head Pressure Drop | 2.24 atm |

With this design, convergent channels are patterned into a sheet of material with a thickness of approximately 0.15 mm. The outlet orifices of the head/nozzles are repeated on a pitch of 2.5 mm. At a head/nozzle pressure of approximately 2.24 atmospheres, paste of 1000 poise is ejected at a rate of 1 cm/sec. The central stripe of silver is approximately 50 microns wide with an aspect ratio of 3:1.

Figure 12:
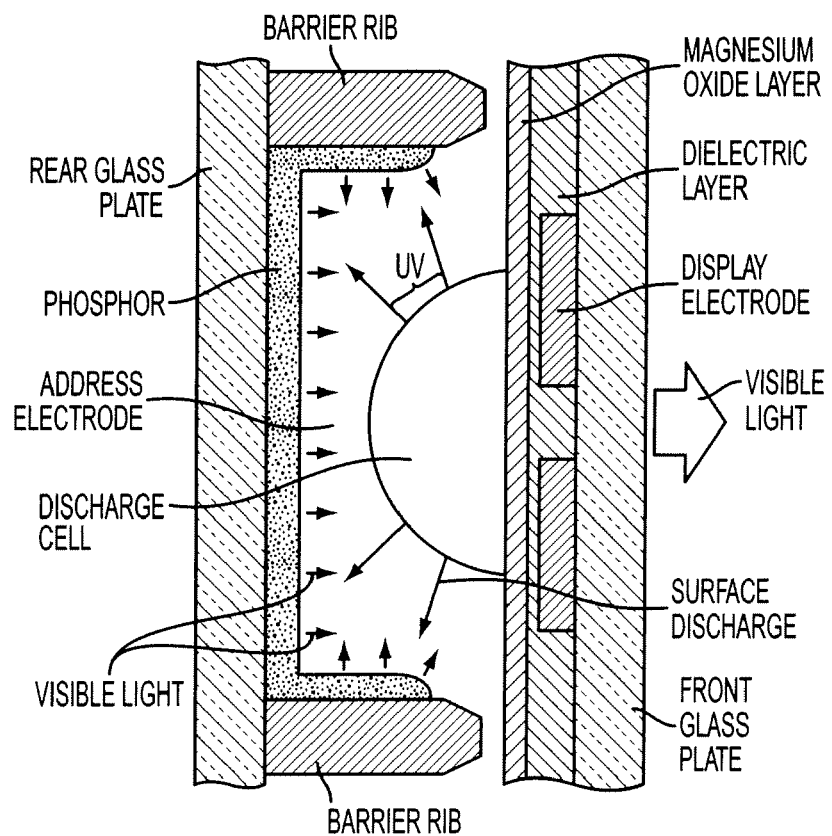
FIG. 12 is a simplified cross-sectional side view showing a portion of an exemplary plasma display panel.

Although the present invention has been described with respect to certain specific embodiments, it will be clear to those skilled in the art that the inventive features of the present invention are applicable to other embodiments as well, all of which are intended to fall within the scope of the present invention. For example, in addition to striped materials with a lateral variation, variations of head 130 may be used to additionally and/or alternatively introduce materials with a vertical variation, for example, for introducing barrier layers onto the substrate. Such vertical variation can be implemented by forming channels that converge dissimilar materials together in the vertical direction (in addition to converging in the horizontal direction) within the manifold. For instance, with a solar cell application, it may be advantageous to introduce a metal bi-layer onto the cell surface with one metal making contact to the silicon as a diffusion barrier, and a second metal on top selected for either lower cost or higher conductance. In addition to metal gridlines, the methods and structures described herein may be utilized to generate gridlines formed from electrically non-conductive materials. For example, another practical device that benefits from rapid and economical means for generating high aspect ratio lines and features include plasma display panels, such as that shown in FIG. 12, where high aspect-ratio barrier ribs define the sub-pixels within the display. The barrier rib is an electrically insulating structure (e.g., inorganic glass), and is preferably a high aspect ratio structure, as this improves the dot per inch resolution and fill factor of the display. In another alternative embodiment, the reference surface(s) can be formed on protruding (instead of indented) sections that extend from the side edge of the relevant layer, with the raise section being removed during the final stages of the trimming process.

The invention claimed is:

1. A method for fabricating an extrusion head for a micro extrusion apparatus, the extrusion head having a plurality of fluidic channels for extruding material on a substrate, the method comprising:
forming a first sheet such that the first sheet defines at least one reference surface and an extrusion cavity including an outlet region such that the reference surface is disposed in proximity to the outlet region;
securing the first sheet between second and third sheets to form said extrusion head such that the extrusion cavity and one or more of the second and third sheets form an associated fluidic channel, and such that side edges of the first, second and third sheets collectively form an edge surface of the extrusion head, wherein the side edge of the first sheet defines both an outlet orifice communicating with said outlet region of the extrusion cavity and a notch, wherein the reference surface is disposed in the notch such that the reference surface is indented from the edge surface by an initial distance, and the reference surface is offset from the edge surface by a portion of side edge of the first plate; and
trimming the edge surface of the extrusion head by removing material from the side edges of the first, second and third sheets until the reference surface is separated from the edge surface by a predetermined distance, the predetermined distance being less than the initial distance.

2. The method according to claim 1, wherein forming the extrusion cavity comprises defining a central cavity and opposing first and second side cavities arranged such that the central channel and first and second side cavities communicate with the associated outlet region.

3. The method according to claim 2, wherein the first and second side cavities define an effective width of the extrusion cavity, and wherein forming the at least one reference surface comprises disposing first and second reference surfaces within the effective width of the extrusion cavity.

4. The method according to claim 2, further comprising forming the second and third sheets such that each of the second and third sheets includes an inlet opening that, after said securing, is disposed opposite to a closed end of one of said central and first and second side cavities.

5. The method according to claim 2, wherein securing the first sheet between the second and third sheets comprises positioning the first sheet between the second and third sheets, and then utilizing at least one of an adhesive and high pressure to bond the second and third sheets to the first sheet.

6. The method according to claim 2, wherein trimming the edge surface comprises machining the edge surface and measuring the distance between the edge surface and the at least one reference surface.

7. The method according to claim 1,
wherein forming the first sheet comprises forming multiple rows, each of said multiple rows including a plurality of said reference surfaces and said extrusion cavities arranged in a straight line;
wherein securing the first sheet between second and third sheets to form said extrusion head comprises:
forming a block including said multiple rows of said reference surfaces and said extrusion cavities; and
dicing said block to separate said multiple rows along corresponding edge surfaces, thereby producing multiple extrusion heads, each of said multiple extrusion heads including a corresponding row of said reference surfaces and said extrusion cavities disposed along an associated one of said corresponding edge surfaces.

8. The method according to claim 7, wherein forming said first, second and third sheets comprises forming at least one dicing notch in each of the first, second and third sheets, and wherein dicing said block comprises cutting said stacked plates along a straight line extending between associated dicing notches.

9. The method according to claim 7, wherein forming said first sheet comprises forming a plurality of T-shaped openings such that each T-shaped opening has a vertical portion communicating with the outlet region of an associated extrusion cavity, a horizontal portion, and first and second bar portions disposed at opposing ends of the horizontal portion, wherein first and second said reference surfaces are disposed in the first and second bar portions, respectively.

10. The method according to claim 9, wherein dicing said block comprises cutting the block along the horizontal portion.

* * * * *